(12) United States Patent
Nagasato

(10) Patent No.: US 10,856,406 B2
(45) Date of Patent: Dec. 1, 2020

(54) PRINTED WIRING BOARD

(71) Applicant: Rohm Co., Ltd., Kyoto (JP)

(72) Inventor: Masashi Nagasato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 83 days.

(21) Appl. No.: 15/099,905

(22) Filed: Apr. 15, 2016

(65) Prior Publication Data
US 2016/0309592 A1   Oct. 20, 2016

(30) Foreign Application Priority Data

Apr. 20, 2015 (JP) .................. 2015-085908

(51) Int. Cl.
*H05K 1/18* (2006.01)
*H05K 1/02* (2006.01)
*H05K 3/46* (2006.01)

(52) U.S. Cl.
CPC .......... *H05K 1/0243* (2013.01); *H05K 1/025* (2013.01); *H05K 3/4685* (2013.01); *H05K 1/0242* (2013.01); *H05K 2201/09154* (2013.01); *H05K 2201/09609* (2013.01); *H05K 2201/09618* (2013.01); *H05K 2201/09727* (2013.01); *H05K 2201/09736* (2013.01); *H05K 2201/1009* (2013.01); *H05K 2201/10053* (2013.01); *H05K 2201/10704* (2013.01); *H05K 2201/10719* (2013.01); *H05K 2201/10734* (2013.01)

(58) Field of Classification Search
CPC .... H05K 1/0243; H05K 1/025; H05K 1/0242; H05K 3/4685; H05K 2201/10704; H05K 2201/09736; H05K 2201/09609; H05K 2201/09154; H05K 2201/10734; H05K 2201/10719; H05K 2201/10053; H05K 2201/1009; H05K 1/0218; H05K 1/0219; H05K 1/0306; H05K 3/361; H05K 3/366; H05K 2201/0715; H05K 2201/1034; H05K 2201/9618; H05K 2201/9727

See application file for complete search history.

(56) References Cited

U.S. PATENT DOCUMENTS

| | | | | |
|---|---|---|---|---|
| 5,313,366 A | * | 5/1994 | Gaudenzi | H01L 23/49811 174/262 |
| 5,838,549 A | * | 11/1998 | Nagata | H05K 1/0216 361/794 |
| 6,278,264 B1 | * | 8/2001 | Burstein | H02M 3/00 323/282 |

(Continued)

FOREIGN PATENT DOCUMENTS

JP   2011-211147   10/2011

*Primary Examiner* — Paresh H Paghadal
(74) *Attorney, Agent, or Firm* — Fish & Richardson P.C.

(57) ABSTRACT

A printed wiring board used to suppress parasitic component is provided. The printed wiring board 100 includes a multi-layer substrate 110, and a power line 50 laid on the multi-layer substrate 110 and connected with a power terminal row T11a-T11d of a semiconductor device 10. The power line 50 includes a first wiring pattern 51 formed on a surface of the multi-layer substrate 110, a second wiring pattern 52 formed within the multi-layer substrate 110, and interlayer connections 53x and 53y electrically conducting the first wiring pattern 51 and the second wiring pattern 52 to bypass at least a portion of the power terminal row T11a-T11d.

19 Claims, 21 Drawing Sheets

(56) References Cited

U.S. PATENT DOCUMENTS

| | | | | |
|---|---|---|---|---|
| 6,346,679 B1* | 2/2002 | Nakamura | H01L 23/49816 | 174/259 |
| 6,608,379 B2* | 8/2003 | Yeo | H01L 23/3677 | 228/180.22 |
| 6,787,920 B2* | 9/2004 | Amir | H01L 23/5386 | 174/260 |
| 7,019,362 B2* | 3/2006 | Sakamoto | H01L 24/02 | 257/327 |
| 7,405,477 B1* | 7/2008 | Tao | H01L 23/49838 | 257/659 |
| 7,910,156 B2* | 3/2011 | Card | H01C 1/144 | 427/96.1 |
| 7,960,833 B2* | 6/2011 | Sutardja | H01L 24/37 | 257/758 |
| 8,437,583 B2* | 5/2013 | Ban | G02B 6/4201 | 385/14 |
| 10,033,275 B2* | 7/2018 | Ishii | H02M 3/158 | |
| 2002/0181185 A1* | 12/2002 | Kabumoto | H01L 23/49822 | 361/306.3 |
| 2005/0140434 A1* | 6/2005 | Abe | H03F 3/195 | 330/66 |
| 2006/0055049 A1* | 3/2006 | Nelson | H01L 23/49838 | 257/774 |
| 2006/0202337 A1* | 9/2006 | Rotaru | H01L 23/3107 | 257/754 |
| 2007/0246772 A1* | 10/2007 | Lee | H01L 23/49562 | 257/341 |
| 2009/0256245 A1* | 10/2009 | Liu | H01L 23/49548 | 257/666 |
| 2010/0215324 A1* | 8/2010 | Ban | G02B 6/4201 | 385/88 |
| 2010/0237492 A1* | 9/2010 | Sasaki | H01L 23/49838 | 257/692 |
| 2011/0095418 A1* | 4/2011 | Lim | H01L 23/3128 | 257/737 |
| 2011/0273014 A1* | 11/2011 | Naito | H02M 1/44 | 307/43 |
| 2012/0261178 A1* | 10/2012 | Kusumoto | G06F 17/5077 | 174/262 |
| 2012/0273929 A1* | 11/2012 | Jiang | H01L 23/49572 | 257/673 |
| 2012/0326272 A1* | 12/2012 | Rokuhara | H01L 25/105 | 257/532 |
| 2013/0021739 A1* | 1/2013 | Kim | H05K 1/0227 | 361/679.31 |
| 2013/0049730 A1* | 2/2013 | Kato | H01L 23/642 | 323/355 |
| 2013/0161076 A1* | 6/2013 | Okada | H01R 13/6474 | 174/254 |
| 2014/0045546 A1* | 2/2014 | Onodera | H01P 5/12 | 455/550.1 |
| 2014/0066834 A1* | 3/2014 | Oshima | A61M 5/14232 | 604/19 |
| 2015/0010694 A1* | 1/2015 | Miyazaki | H05K 3/4647 | 427/96.9 |
| 2015/0075848 A1* | 3/2015 | Naganuma | H05K 3/4623 | 174/255 |
| 2015/0214141 A1* | 7/2015 | Ye | H01L 24/05 | 257/401 |
| 2016/0345429 A1* | 11/2016 | Ishiwata | H05K 1/0218 | |
| 2016/0380606 A1* | 12/2016 | Limjoco | H01L 23/3107 | 361/767 |
| 2017/0048963 A1* | 2/2017 | Murakami | H05K 1/023 | |
| 2017/0214319 A1* | 7/2017 | Wang | H01L 23/49562 | |
| 2017/0294441 A1* | 10/2017 | Nakanishi | H01L 51/0575 | |

* cited by examiner

PRINTED WIRING BOARD

BACKGROUND

The present invention relates to a printed wiring board.

Conventionally, semiconductor devices for driving the switch output stage connected between the power line and the ground line have been widely used in various applications.

Further, regarding the prior technical literature, patent literature 1 listed below is provided as an example.

[Patent literature 1] Japanese patent laid-open publication No. 2011-211147.

BRIEF SUMMARY OF THE INVENTION

Problems to be Solved in the Present Invention

However, in the case where a large current flows into the switch output stage, the effects of the parasitic components (in particular, the parasitic inductance component or the parasitic resistance component) accompanying the power line or the ground line of the printed wiring board for mounting the semiconductor device will become dominant, thereby resulting in the possibility of the high level drop or ringing of the switching voltage.

In light of the problems discovered by the present inventor as discussed above, one purpose of the invention disclosed herein is to provide a printed wiring board that inhibits the parasitic components of the printed wiring and electronic apparatus using such printed wiring board.

Technical Means for Solving Problems

A printed wiring board disclosed herein is configured as follows (the first configuration): the printed wiring board comprises a multi-layer substrate; a power line laid on the multi-layer substrate and connected with a power terminal row of a semiconductor device; and a ground line laid on the multi-layer substrate and connected with a ground terminal row of the semiconductor device; and at least one of the power line and the ground line comprises, a first wiring pattern formed on a surface of the multi-layer substrate, a second wiring pattern formed within the multi-layer substrate, and an interlayer connection electrically conducting the first wiring pattern and the second wiring pattern to bypass at least a portion of the power terminal row or the ground terminal row.

Further, in the printed wiring board comprising the first configuration (the second configuration), a width, a thickness, or an electric conductivity of the second wiring pattern is greater than a width, a thickness, or an electric conductivity of the first wiring pattern.

Further, in the printed wiring board comprising the first or the second configuration (the third configuration), the interlayer connection is formed in the vicinity of or directly below the power terminal row, or formed in the vicinity of or directly below the ground terminal row.

Further, in the printed wiring board comprising one of the first to the third configuration (the fourth configuration), the configuration further comprises an insulating layer that separates the first wiring pattern from the second wiring pattern, and the insulating layer has a thickness of less than about 200 µm.

Further, in the printed wiring board comprising one of the first to the fourth configuration (the fifth configuration), a second wiring pattern of the power line and a second wiring pattern of the ground line are overlapped with each other so that respective currents flow in opposite directions.

Further, an electronic apparatus disclosed herein is configured as follows (the sixth configuration): the electronic apparatus comprises a printed wiring board comprising the first to the fifth configuration, and a semiconductor device mounted on the printed wiring board.

Further, in the electronic apparatus comprising the sixth configuration (the seventh configuration), a plurality of external terminals disposed at the semiconductor device are pins, solder balls, or electrode pads, and are arranged in an array on a bottom surface of a package.

Further, in the electronic apparatus comprising the sixth or the seventh configuration (the eighth configuration), the semiconductor device functions as a part of a power supply device that uses a switch output stage connected between a power terminal and a ground terminal to generate an expected output voltage from a power supply voltage.

Further, in the electronic apparatus comprising the sixth or the seventh configuration (the ninth configuration), the semiconductor device functions as a part of a transmission device that uses a switch output stage connected between a power terminal and a ground terminal to transmit a digital signal.

Further, in the electronic apparatus comprising the sixth or the seventh configuration (the ninth configuration), the semiconductor device functions as a part of a motor driving device that uses a switch output stage connected between a power terminal and a ground terminal to drive a motor.

Effects of the Present Invention

According to the invention disclosed herein, a printed wiring board that inhibits the parasitic components of the printed wiring and an electronic apparatus using such printed wiring board are provided.

DETAILED DESCRIPTION

<Switching Power Supply Device>

Figure 1:
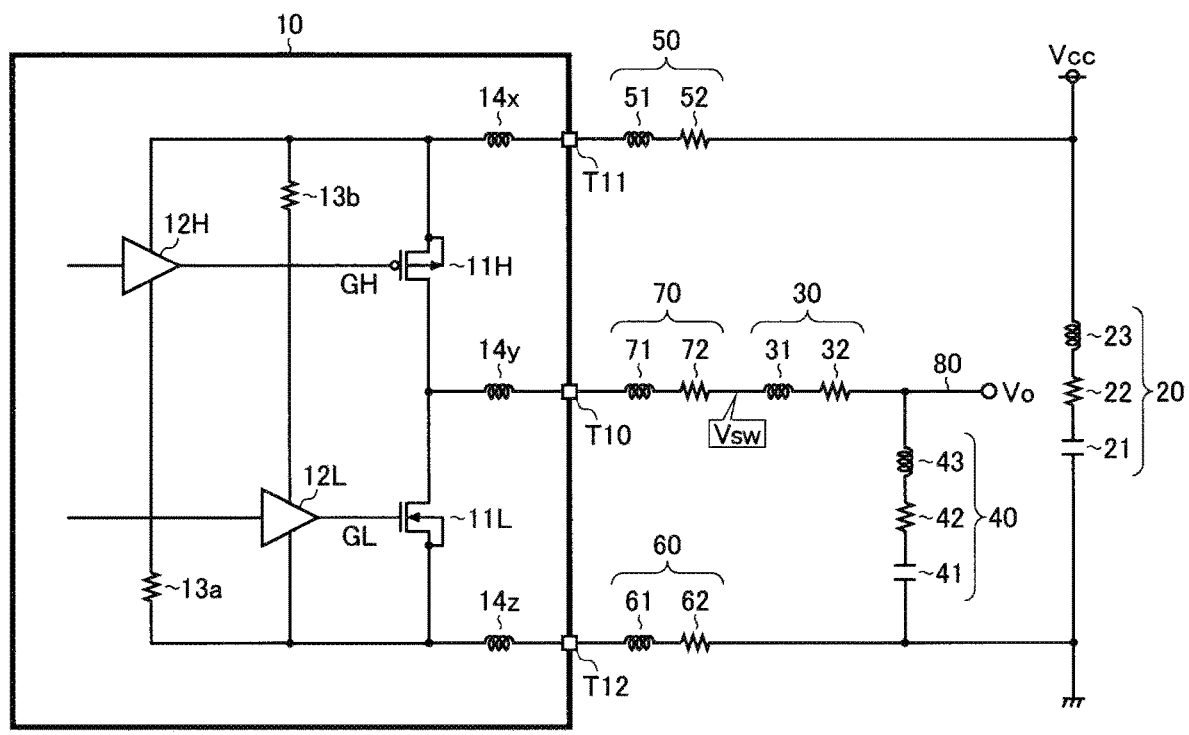
FIG. 1 is a circuit diagram illustrating one example of the configuration of the switching power supply device.

FIG. 1 is a circuit diagram illustrating a configuration example of a switching power supply device. The switching power supply device 1 according to this configuration example comprises: a semiconductor device 10 and various discrete components (a bypass capacitor 20, an output inductor 30, and an output capacitor 40) disposed externally to the semiconductor device 10. The switching power supply device 1 reduces the voltage of a power supply voltage Vcc by using a switch output stage (in the present illustrated example, an output transistor 11H and a synchronous rectifying transistor 11L that are integrated within the semiconductor device 10), so as to generate the expected output voltage Vo.

The semiconductor device 10 is an integrated circuit (IC) or large scale integrated (LSI) circuit that functions as a part of the switching power supply device 1, and comprises the output transistor 11H, the synchronous rectifying transistor 11L, a high-side driver 12H and a low-side driver 12L. Further, the control circuit and fail-safe circuit that are not illustrated are also integrated in the semiconductor device 10.

Further, the semiconductor device 10 comprises a plurality of external terminals (exemplary terminals in this drawing include, a switch terminal T10, a power terminal T11, and a ground terminal T12), that are used as a means for establishing the electric connection with external components. The switch terminal T10 is the external terminal for externally connecting a switch line 70. The power terminal T11 is the external terminal for externally connecting a power line 50. The ground terminal T12 is the external terminal for externally connecting a ground line 60.

The output transistor 11H is a P channel type metal oxide semiconductor field effect transistor (PMOSFET) that functions as the high-side switch of the switch output stage. The source and back gate of the output transistor 11H are internally connected with the power terminal T11. The drain of the output transistor 11H is internally connected with the switch terminal T10. The gate of the output transistor 11H is connected with the applying end of a high-side gate signal GH (the output end of the high-side driver 12H). The output transistor 11H is turned off when the high-side gate signal GH is at the high level, and is turned on when the high-side gate signal GH is at the low level.

The synchronous rectifying transistor 11L is the N channel type MOSFET (NMOSFET) that functions as the low-side switch of the switch output stage. The source and back gate of the synchronous rectifying transistor 11L are internally connected with the ground terminal T12. The drain of the synchronous rectifying transistor 11L is internally connected with the switch terminal T10. The gate of the synchronous rectifying transistor 11L is connected with the applying end of a low-side gate signal GL (the output end of the low-side driver 12L). The synchronous rectifying transistor 11L is turned on when the gate signal GL is at the high level, and turned off when the gate signal GL is at the low level.

At the switch output stage, the output transistor 11H and the synchronous rectifying transistor 11L are complementarily turned on and off. By using the above-mentioned operation of turning on and off, a switching voltage Vsw is generated at the switch terminal T10 (or the switch line 70); the switching voltage Vsw is a rectangular wave driven by pulses between a power supply voltage Vcc and a ground voltage GND. Further, as used herein, the term "complementarily" comprises not only the situation in which the on/off state of the output transistor 11H and the synchronous rectifying transistor 11L are completely opposite, but also the situation where two transistors are turned off at the same time (dead-time).

Moreover, the switch output stage is not limited to the above-mentioned synchronous rectifying method; rather, it may adopt a diode rectifying method which uses a rectifying diode to replace the synchronous rectifying transistor 11L.

The high-side driver 12H is connected between the power terminal T11 and the ground terminal T12, and generates the high-side gate signal GH based on the high-side driver control signal inputted from a control circuit that is not illustrated.

The low-side driver 12L is connected between the power terminal T11 and the ground terminal T12, and generates the low-side gate signal GL based on the low-side driver control signal inputted from the control circuit that is not illustrated.

Moreover, the internal wiring connecting the high-side driver 12H with the ground terminal T12 and the internal wiring connecting the low-side driver 12L with the power terminal T11 have parasitic resistance components 13a and 13b accompanied, respectively. Further, the power terminal T11, the switch terminal T10, and the ground terminal T12 have parasitic inductance components 14x to 14z accompanied, respectively.

The bypass capacitor 20 is the means for inhibiting the power supply fluctuation of the semiconductor device 10, and is connected between the power line 50 and the ground line 60. Further, the bypass capacitor 20, in addition to a capacitance component 21, further comprises an equivalent series resistance component 22 and an equivalent series inductance component 23. For the bypass capacitor 30, it is desirable to use a laminated ceramic capacitor that has a more compact component size, a smaller equivalent series resistance component 22 or equivalent series inductance component 23, and a wider operation temperature range.

The output inductor 30 and the output capacitor 40 form an LC filter, which generates the output voltage Vo by rectifying and smoothing the switching voltage Vsw. The first end of the output inductor 30 is connected to the switch line 70. The second end of the output inductor 30 and the first end of the output capacitor 40 are both connected to the output line 80. The second end of the output capacitor 40 is connected to the ground line 60. Moreover, the output inductor 30, in addition to the inductance component 31, further comprises an equivalent series resistance component 32. Moreover, the output capacitor 40, in addition to the capacitance component 41, further comprises an equivalent series resistance component 42 and an equivalent series inductance component 43.

The power line 50 is the printed wiring configured to electrically connect the applying end of the power supply voltage Vcc with the power terminal T11. The power line 50 has a parasitic inductance component 51 and a parasitic resistance component 52 accompanied.

The ground line 60 is the printed wiring configured to electrically connect the ground end (the applying end of the ground voltage GND) with the ground terminal T12. The ground line 60 has a parasitic inductance component 61 and a parasitic resistance component 62 accompanied.

The switch line 70 is the printed wiring configured to electrically connect the first end of the output inductor 30 with the switch terminal T10. The switch line 70 has a parasitic inductance component 61 and a parasitic resistance component 62 accompanied.

The output line 80 is the printed wiring configured to electrically connect the second end of the output inductor 30 and the first end of the output capacitor 40 with the output end of the output voltage Vo. The output line 80, similar to the other printed wirings, has a parasitic inductance component and a parasitic resistance component accompanied. However, in the present drawing, these components are omitted to facilitate the illustration.

Printed Wiring Board (The First Embodiment)

Figure 2:
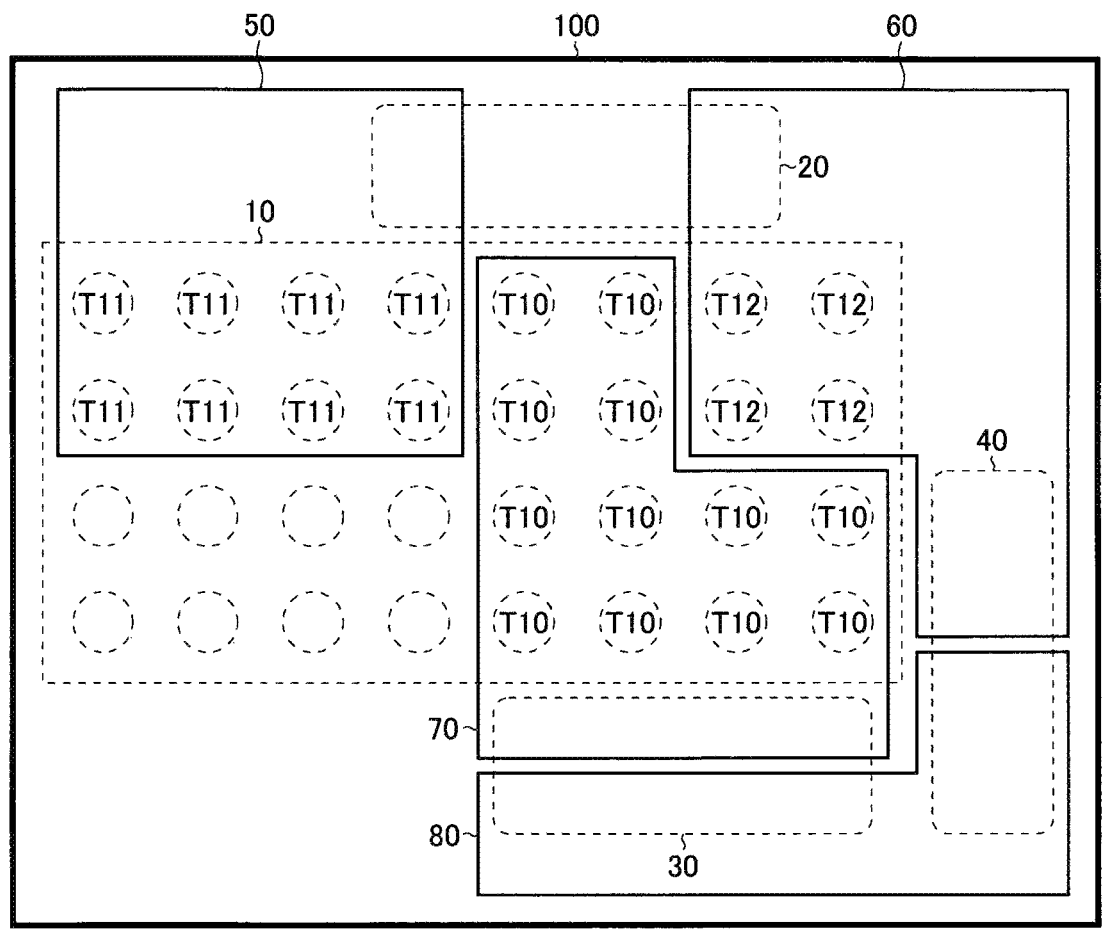
FIG. 2 is a top view illustrating the first embodiment of the printed wiring board (the first wiring layer).

FIG. 2 is a top view illustrating the printed wiring board 100 mounted with the switching power supply device 1, according to the first embodiment of this application. In this drawing, the power line 50, the ground line 60, the switch line 70, and the output line 80 that are patterned on the printed wiring board 100 are depicted in solid line. However, the semiconductor device 10, the bypass capacitor 20, the output inductor 30, and the output capacitor 40 are all depicted in broken line.

At the bottom surface of the semiconductor device 10, a plurality of external terminals is arranged in an array, and the plurality of external terminals is comprised of a plurality of switch terminals T10, a plurality of power terminals T11 and a plurality of ground terminals T12 (in the present illustrated example, there are twelve switch terminals T10, eight power terminals T11, and four ground terminals T12). Each of the switch terminals T10, the power terminals T11 and the ground terminals T12 is commonly connected within the semiconductor device 10. By such configuration design, the parasitic inductance components 14x to 14z accompanying each terminal or the parasitic resistance components 52 to 72 accompanying the bonding portion between each terminal and the printed wiring board 100 can be reduced.

Moreover, patterns of the power line 50, ground line 60 and switch line 70 are designed to be as thick and short as possible. By such configuration design, it is possible to reduce the parasitic components (the parasitic inductance components 51 to 71 or the parasitic resistance components 52 to 72) accompanying the respective lines.

Moreover, the bypass capacitor 20 is disposed in the immediate vicinity of the semiconductor device 10 (in the immediate vicinity of the power terminal T11 or the ground terminal T12). By such configuration design, the effect caused by the parasitic components (the parasitic inductance components 51 to 61 or the parasitic resistance components 52 to 62) accompanying the power line 50 or the ground line 60 can be minimized as much as possible.

In this way, in the printed wiring board 100 of the first embodiment (or in the semiconductor device 10 mounted on the printed wiring board 100), the reduction of the parasitic components accompanying the printed wiring can be realized by the series connection of external terminals, adoption of thick and short wiring patterns, and the proximal connection between the semiconductor device 10 and the bypass capacitor 20.

Moreover, the power line 50 and the ground line 60 are disposed separately with the switch line 70 sandwiched therebetween. Due to such configuration design, short-circuiting hardly occurs between the power line 50 and the ground line 60, thereby increasing the safety.

Nonetheless, in the case where a large current flows into the power line 50 or the ground line 60, even with the above-mentioned configuration, it is not feasible to ignore the effects caused by the respective accompanying parasitic components (the parasitic inductance components 51 to 61 or the parasitic resistance components 52 to 62), and hence, there exists the possibility of high level drop or ringing of the switching voltage Vsw.

Further, as discussed above, according to the first embodiment, by using the series connection of the power terminal T11 or the ground terminal T12, as well as the adoption of the power lines 50 or the ground lines 60 that are thick and short, the printed wiring board 100 makes it possible to reduce the respective accompanying parasitic components thereof.

However, in a grid array semiconductor device 10 with a plurality of external terminals arranged at the bottom surface in an array (in which the power terminals T11 or the ground terminals T12 are disposed not only in the vicinity of the periphery of the package, but also near the center of the package), it is necessary that the power line 50 or the ground line 60 extends from the periphery of the package into the interior of the package.

Of course, in the extending portion of the power line 50 or the ground line 60, there is an accompanying parasitic component corresponding to the length thereof. Thus, when the location of the power terminal T11 or the ground terminal T12 is farther from the periphery of the package (that is, closer to the center of the package), it is disadvantageous in terms of impedance, thereby causing problems such as the weakening of the enhanced effect.

Printed Wiring Board (The Second Embodiment)

Hereinbelow, the second embodiment of the printed wiring board 100 is discussed in detail primarily by referencing to FIG. 3 to FIG. 6.

Figure 3:
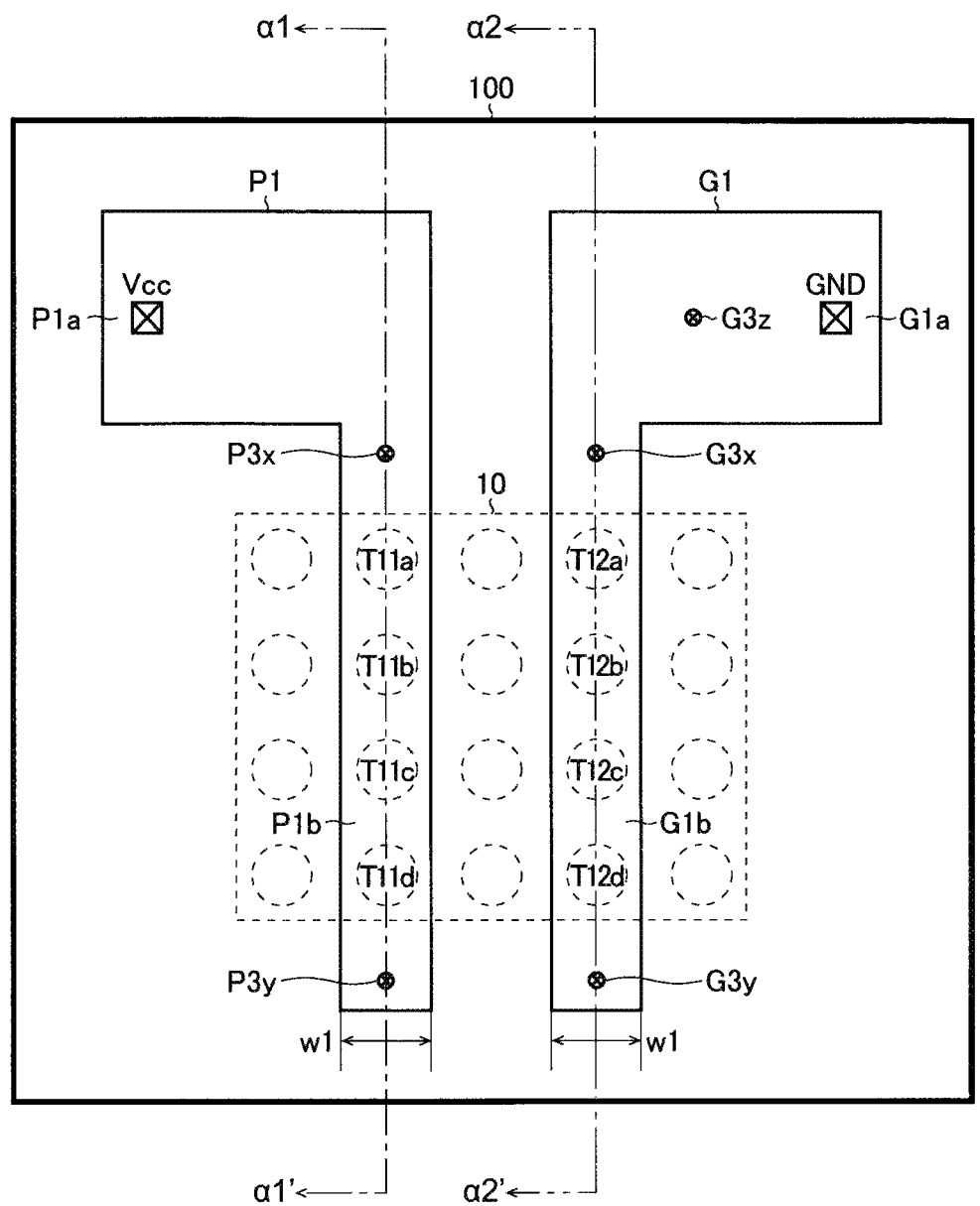
FIG. 3 is a top view illustrating the second embodiment of the printed wiring board (the first wiring layer).

FIG. 3 is a top view illustrating the second embodiment of the printed wiring board 100; in particular, the first wiring layer formed on the surface of the printed wiring board 100. In this drawing, a first power line P1 and a first ground line G1 that are patterned on the first wiring layer are both depicted in solid line. On the other hand, the semiconductor device 10 and the external terminals thereof (including power terminals T11a to T11d and ground terminals T12a to T12d) are all depicted in broken line.

Figure 4:
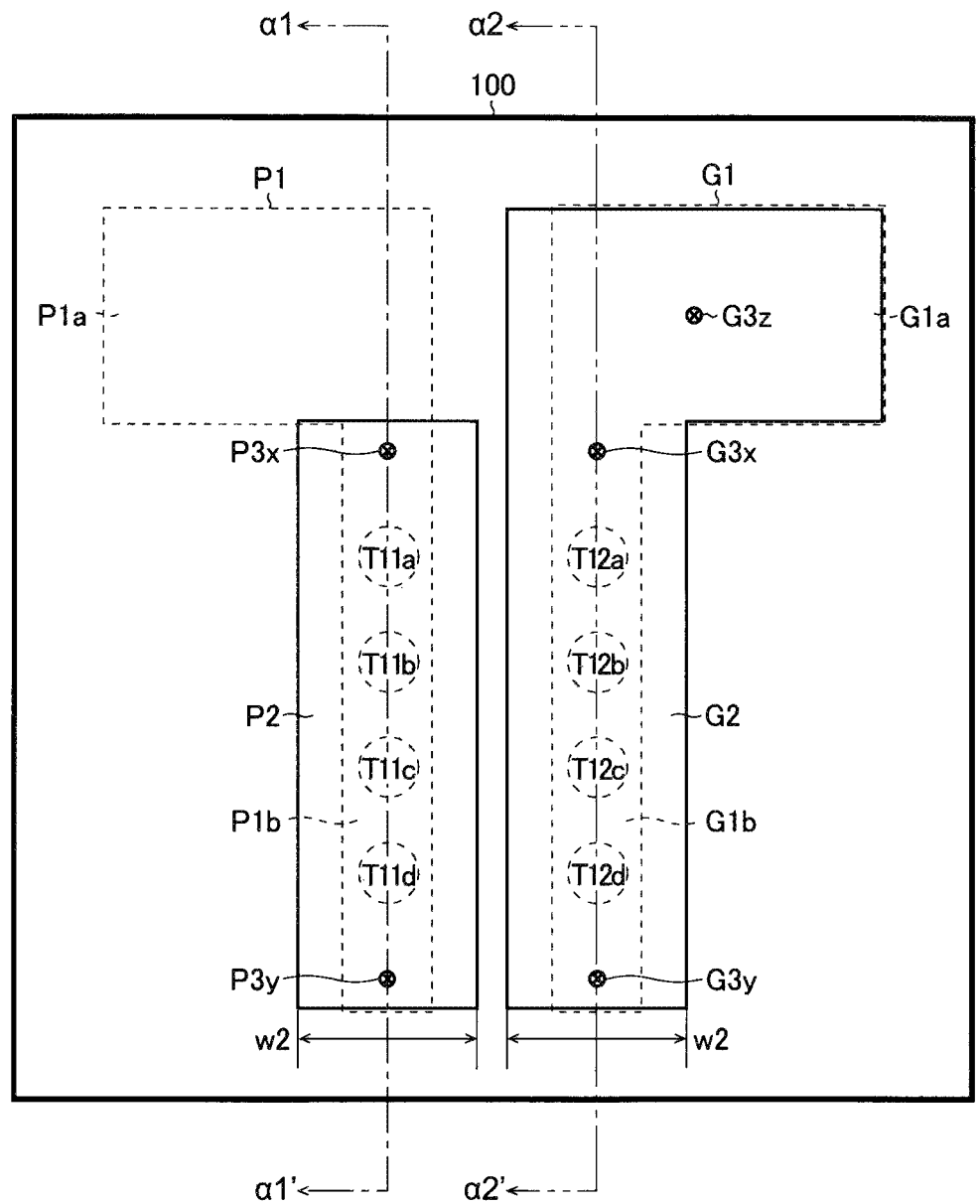
FIG. 4 is a top view illustrating the second embodiment of the printed wiring board (the second wiring layer).

FIG. 4 is a top view illustrating the second embodiment of the printed wiring board 100 (which is the same as the one illustrated in FIG. 3); in particular the second wiring layer formed in the inside of the printed wiring board 100 (i.e., it is lower in relation to the first wiring layer). In the present drawing, the second power line P2 and the second ground line G2 that are patterned on the second wiring layer are both depicted in solid line. Conversely, the first power line P1 and the first ground line G1 that are patterned on the first wiring layer, and the power terminals T11a to T11d and the ground terminals T12a to T12d that are disposed at the semiconductor device 10 are all depicted in broken line.

Figure 5:
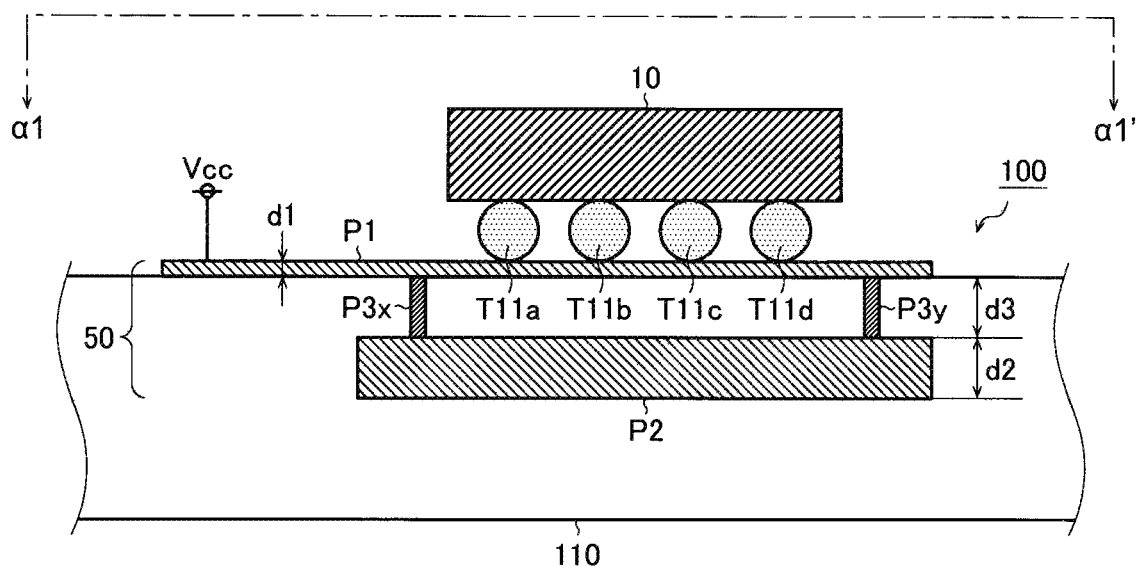
FIG. 5 is a longitudinal section view taken along line $\alpha 1$-$\alpha 1'$.
Figure 6:
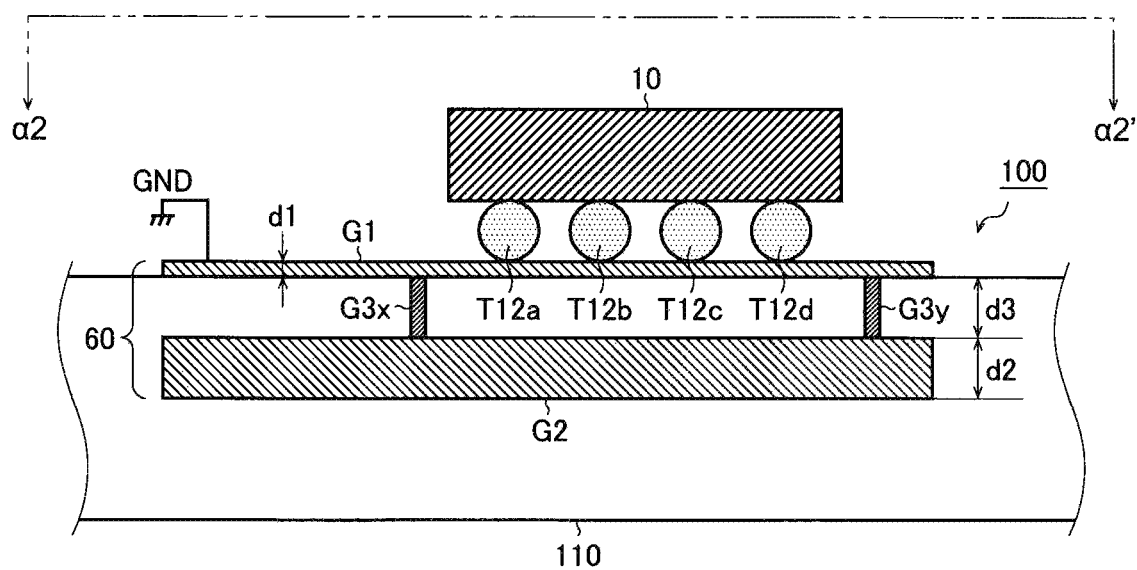
FIG. 6 is a longitudinal section view taken along line $\alpha 2$-$\alpha 2'$.

FIG. 5 is a longitudinal section view taken along line α1-α1' (dot-dash) in FIG. 3 and FIG. 4 that cuts through the printed wiring board 100. Moreover, FIG. 6 is a longitudinal section view taken along line α2-α2' (dot-dot-dash) in FIG. 3 and FIG. 4 that cuts through the printed wiring board 100.

As illustrated in the drawings, the printed wiring board 100 according to the second embodiment comprises a multi-layer substrate 110, and the power line 50 and ground line 60 that are laid on the multi-layer substrate 110. The power line 50 comprises a first power line P1, a second power line P2, and interlayer connections P3x and P3y. The ground line 60 comprises a first ground line G1, a second ground line G2, and interlayer connections G3x to G3z.

The first power line P1 and the first ground line G1 are equivalent to the first wiring pattern (the first wiring layer) formed on the surface of the multi-layer substrate 110. As illustrated in FIG. 3, the first power line P1 comprises a main line portion P1a that is connected with the applying end of the power supply voltage Vcc and a branch line portion P1b that is branched from the main line portion P1a. Similarly, the first ground line G1 comprises a main line portion G1a that is connected with the applying end (ground end) of the ground voltage GND and a branch line portion G1b that is branched from the main line portion G1a.

Each of the branch line portions P1b and G1b extends from the main line portions P1a and G1a towards the mounting position of the semiconductor device 10, and is connected to power terminals T11a to T11d and ground terminals T12a to T12d using the solder, or the like, respectively.

Furthermore, regarding the first power line P1 and the first ground line G1 formed on the first wiring layer, the line thickness d1 thereof should be constrained corresponding to a grid pitch d11 of the semiconductor device 10.

Figure 7:
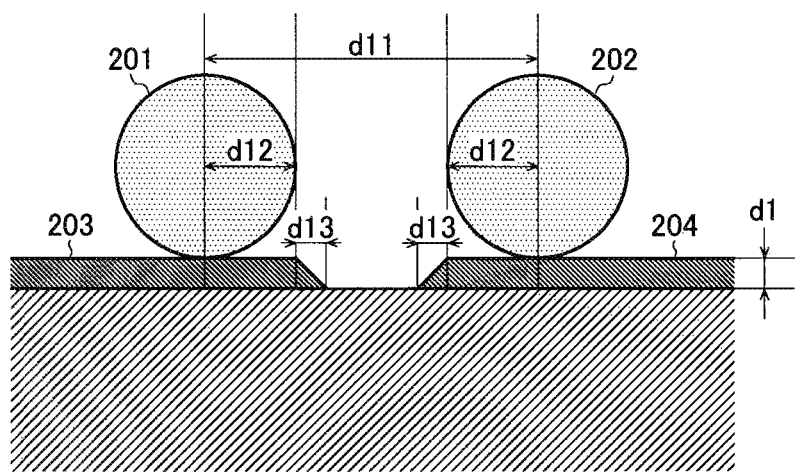
FIG. 7 is a longitudinal section view for illustrating the constraint of the thickness of the first wiring layer.

FIG. 7 is a longitudinal section view that illustrates the constraint of the thickness of the first wiring layer. As illustrated in this drawing, d11 represents the spacing between the adjacent grid 201 and grid 202 (that is, the grid pitch), d12 represents the diameter of the grid, and d13 represents the taper of the first wiring layer 203 and 204; in order to avoid the interference (short-circuiting) between the grid 201 and the grid 202, the following equation [ I ] should be satisfied.

[Equation I]

$$d13 < \frac{d11}{2} - d12 \quad (1)$$

Generally speaking, the greater the line thickness d1 of the first wiring layer 203 and 204, the greater the taper d13. Therefore, the line thickness d1 of the first power line P1 and the first ground line G1 should be designed to be less than the upper limit corresponding to the grid pitch d11 of the semiconductor device 10.

Moreover, in order to avoid the interference (short-circuiting) between the grids, even the line width w1 of the branch line portions P1b and G1b should be limited to be less than the upper limit corresponding to the grid pitch d11 of the semiconductor device 10. That is, the narrower the grid pitch d11 of the semiconductor device 10, the narrower the line width w1 of the branch line portions P1b and G1b, and consequently, the respective parasitic component (the parasitic inductance component or the parasitic resistance component) accompanying therewith becomes higher.

As a result, for the power terminals T11a to T11d and the ground terminals T12a to T12d that are arranged in a row, when the distance between the main line portions P1a and G1a is greater, then the impedance might be deteriorated. More specifically, the power terminal T11a and the ground terminal T12a that are closest to the main line portions P1a and G1a are the most advantageous in terms of impedance; on the contrary, the power terminal T11d and the ground terminal T12d that are farthest from the main line portions P1a and G1a are the least advantageous in terms of impedance.

Therefore, the power line 50 and ground line 60 not only respectively comprise the above-discussed first power line P1 and the first ground line G1 that are patterned on the first wiring layer, but also further comprise the second power line P2 and the second ground line G2 that are patterned on the second wiring layer.

Both the second power line P2 and the second ground line G2 are equivalent to the second wiring pattern (the second wiring layer) formed within the multi-layer substrate 110. For example, as illustrated in FIG. 4, the second power line P2 is designed to overlap with the branch line portion P1b of the first power line P1. Similarly, the second ground line G2 is designed to overlap with the branch line portion G1b of the first ground line G1. Moreover, with respect to the second ground line G2, it is designed to overlap with the main line portion G1a of the first ground line G1.

Nonetheless, the only reason that the second power line P2 and the second ground line G2 are designed to have different layouts is to facilitate the illustration of the layout in a single drawing. Therefore, it is feasible to allow the second power line P2 to overlap with both the main line portion P1a and branch line portion P1b of the first power line P1; alternatively, it is feasible to allow the second ground line G2 to overlap only with the branch line portion G1b of the first ground line G1.

The first power line P1 and the second power line P2 are electrically connected by using the interlayer connections P3x and P3y (e.g., the through via). The interlayer connection P3x is disposed in the immediate vicinity of the power terminal T11a that is closest to the main line portion P1a (the root side of the branch line portion P1b). The interlayer connection P3y is disposed in the immediate vicinity of the power terminal T11d that is farthest from the main line portion P1a (the terminal end side of the branch line portion P1b). That is, the interlayer connections P3x and P3y electrically conduct the first power line P1 and the second power line P2 to bypass a region between two ends of the power terminal row.

Similarly, the first ground line G1 and the second ground line G2 are electrically connected by using the interlayer connections G3x to G3z (e.g., the through via). Further, the interlayer connection G3x is disposed in the immediate vicinity of the ground terminal T12a that is closest to the main line portion G1a (the root side of the branch line portion G1b). However, the interlayer connection G3y is disposed in the immediate vicinity of the ground terminal T12d that is farthest from the main line portion G1a (the terminal end side of the branch line portion G1b). That is, the interlayer connections G3x and G3y electrically conduct the first ground line G1 and the second ground line G2 to bypass a region between two ends of the ground terminal row.

Moreover, the interlayer connection G3z is disposed directly below the main line portion G1a.

Here, the second power line P2 and the second ground line G2 are different from the first power line P1 and the first ground line G1, and hence, are not subject to the constraints corresponding to the grid pitch d11 of the semiconductor device 10. Accordingly, the line width w2 or line thickness d2 can be designed freely.

For example, when the second power line P2 and the second ground line G2 are designed to be wider than the branch line portions P1b and G1b (w2>w1), the parasitic component of the second power line P2 and the second ground line G2 is inhibited to be smaller than the parasitic component of the branch line portions P1b and G1b.

Moreover, when the second power line P2 and the second ground line G2 are thicker than the branch line portions P1b and G1b (d2>d1), the parasitic component of the second power line P2 and the second ground line G2 is also inhibited to be smaller than the parasitic component of the branch line portions P1b and G1b.

Moreover, for example, common copper foils or plated copper ($\sigma$=59.0 [S/m]@20° C.) can be used to form the first power line P1 and the first ground line G1; however, silver foils or plated silver ($\sigma$=61.4 [S/m]@20° C.) with greater electric conductivity can be used to form the second power line P2 and the second ground line G2. By choosing such materials, the parasitic component of the second power line P2 and the second ground line G2 is also inhibited to be smaller than the parasitic component of the branch line portions P1b and G1b.

Furthermore, a thickness d3 of the insulating layers (i.e., the height of the interlayer connections P3x and P3y and interlayer connections G3x to G3z) separating the first wiring pattern (that is, the first power line P1 and the first ground line G1 formed on the first wiring layer) and the second wiring pattern (that is, the second power line P2 and the second ground line G2 formed on second wiring layer) should be preferably as small as possible. More specifically, the thickness d3 of the insulating layer is preferably less than 200 μm; more preferably, less than 100 μm (such as, 80 μm). By such configuration design, it is feasible to inhibit the parasitic component of the interlayer connections P3x and P3y and the parasitic component of the interlayer connections G3x to G3z.

In this way, between the main line portion P1a and the power terminals T11a to T11d and between the main line portion G1a and the ground terminals T12a to T12d, not only a main route passing through branch line portions P1b and G1b with a high impedance is formed, but a bypass route passing through the second power line P2 and the second ground line G2 with a low impedance is also formed.

That is, regarding the power line 50 and ground line 60, a partial multi-layer structure is adopted so that a bypass route with a low impedance is disposed in parallel with respect to the high-impedance branch line portions P1b and G1b.

Thus, when the power terminal row and the ground terminal row are used in parallel, it is feasible to use, more efficiently, not only the power terminal and the ground terminal that are closer to the main line portions P1a and G1a, but also the power terminal and the ground terminal that are farther from the main line portions P1a and G1a.

Figure 8:
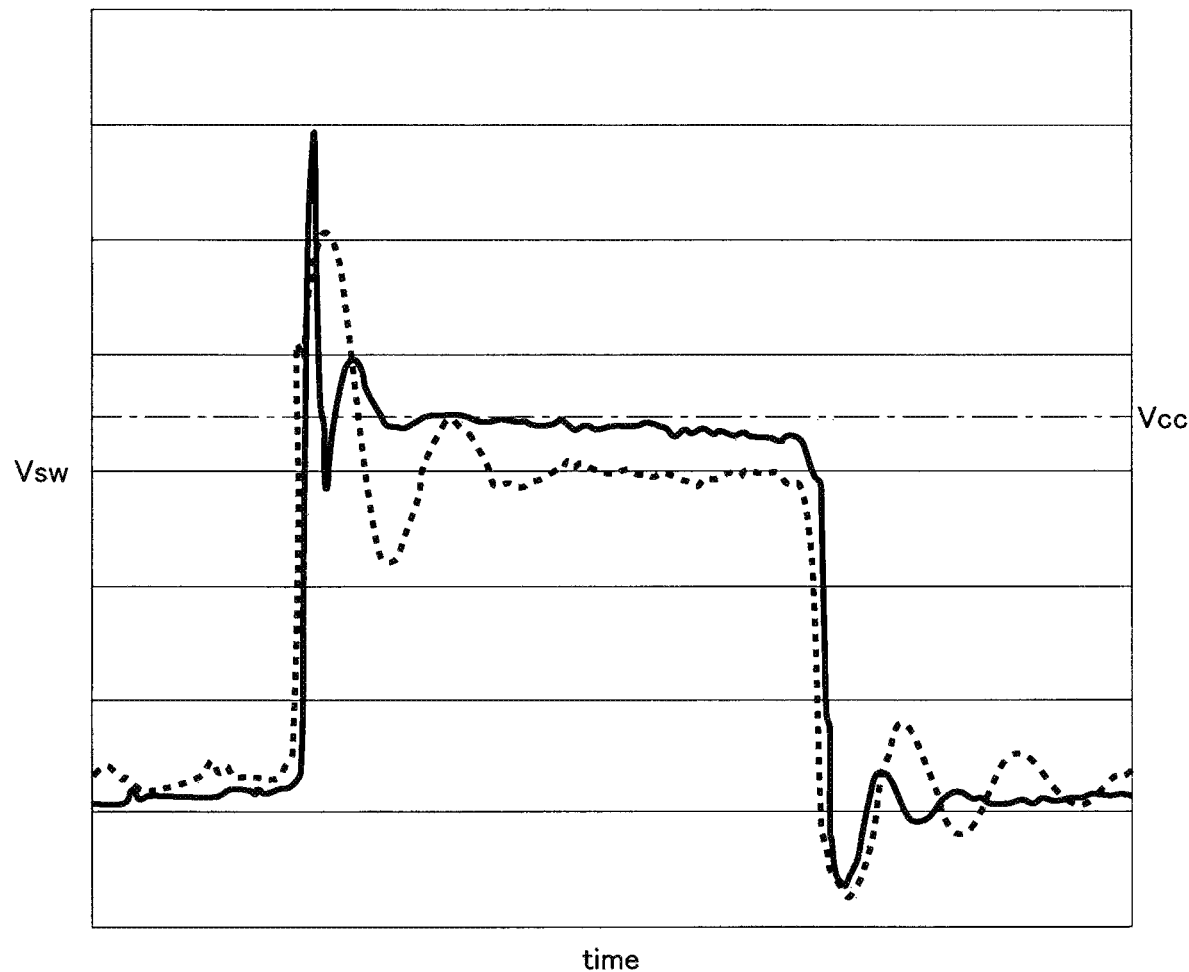
FIG. 8 is an oscillogram of the switching voltage Vsw.

FIG. 8 is an oscillogram of the switching voltage Vsw. Moreover, the solid line represents the behavior of the second embodiment, while the broken line represents the behavior of the first embodiment. As illustrated in the present drawing, by using the configuration of the second embodiment, it is feasible to inhibit the high level drop or ringing of the switching voltage efficiently, and consequently, a more reliable switching operation can be realized.

In particular, in the case where a large current flows into the power line 50 or the ground line 60, the effect caused by the respective accompanying parasitic component (the parasitic inductance components 51 to 61 or the parasitic resistance components 52 to 62) becomes more obvious; therefore, it is more desirable to adopt the configuration of the second embodiment.

Further, in the second embodiment, the power terminals T11a to T11d and the ground terminals T12a to T12d that are arranged in straight rows are used as an example of the configuration of the power terminal row and ground terminal row of the semiconductor device 10 for the sake of brevity; however, the pattern of the arrangement is not limited thereto; for example, the arrangement of the power terminal row and ground terminal row may curve midway, or branch into two or more directions. Moreover, the number of the power terminal rows or ground terminal rows that are connected in series or in parallel is not limited.

Moreover, as discussed above, the second power line P2 and the second ground line G2 are respectively used as the low-impedance routes to allow the terminal end of the branch line portions P1b and G1b being bypassed to the main line portions P1a and G1a (or the root side of the branch line portions P1b and G1b). Therefore, any layout of the second power line P2 and the second ground line G2 that is capable of attaining such bypassing function can be used.

Printed Wiring Board (The Third Embodiment)

Hereinbelow, the third embodiment of the printed wiring board 100 is discussed in detail by referencing FIG. 9 to FIG. 12.

Figure 9:
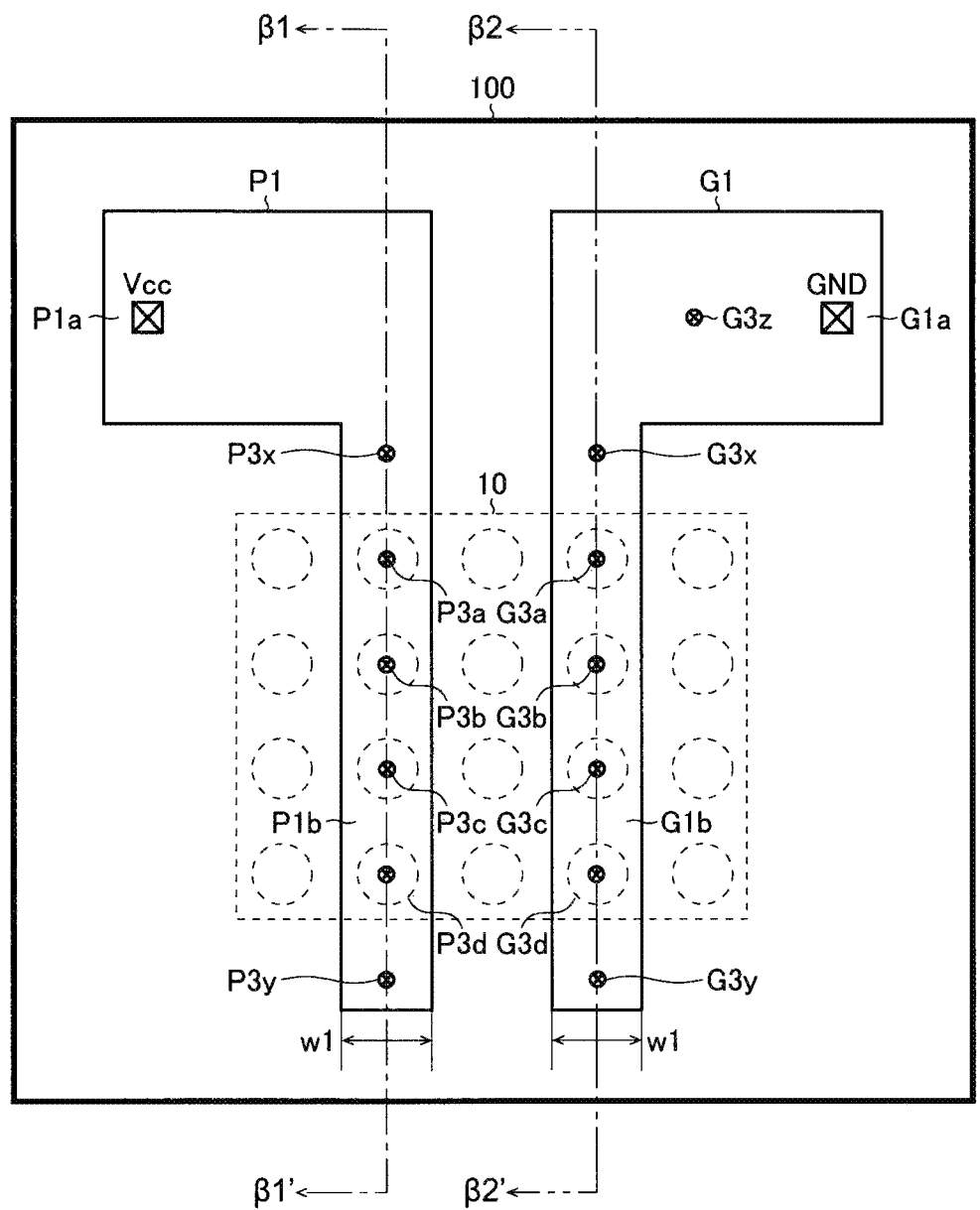
FIG. 9 is a top view illustrating the third embodiment of the printed wiring board (the first wiring layer).

FIG. 9 is a top view illustrating the third embodiment of the printed wiring board 100; in particular, the first wiring layer formed on the surface of the printed wiring board 100. In the present drawing, the first power line P1 and the first ground line G1 patterned on the first wiring layer are both depicted in solid line. However, the semiconductor device 10 and the external terminals thereof (including the power terminals T11a to T11d and the ground terminals T12a to T12d) are all depicted in broken line.

Figure 10:
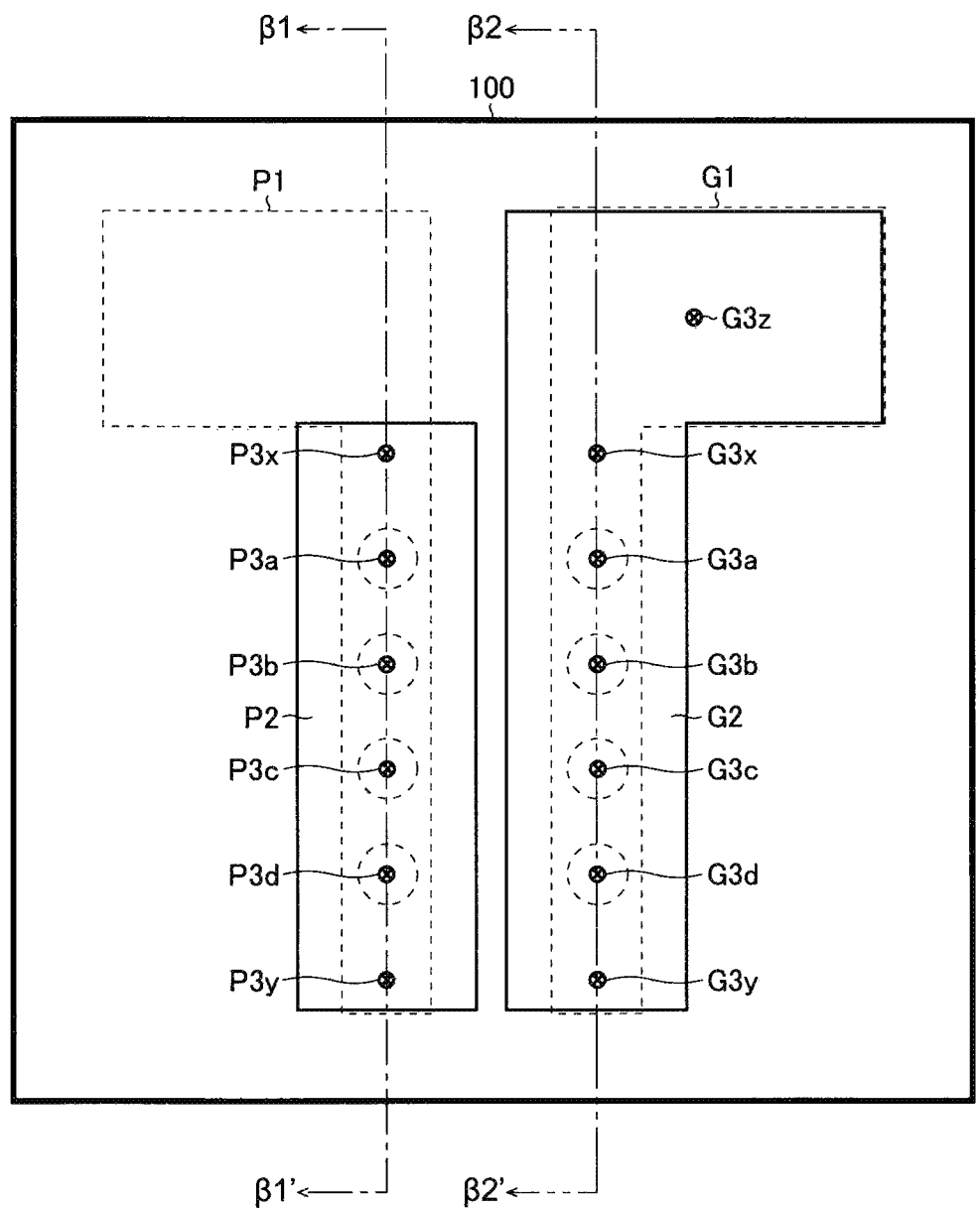
FIG. 10 is a top view illustrating the third embodiment of the printed wiring board (the second wiring layer).

FIG. 10, similar to FIG. 9, is a top view illustrating the third embodiment of the printed wiring board; in particular, the second wiring layer that is formed within the printed wiring board 100 (which is lower in relation to the first wiring layer). In the present drawing, the second power line P2 and the second ground line G2 patterned on the second wiring layer are both depicted in solid line. However, the first power line P1 and the first ground line G1 patterned on the first wiring layer, and the power terminals T11a to T11d and the ground terminals T12a to T12d disposed at the semiconductor device 10 are all depicted in broken line.

Figure 11:
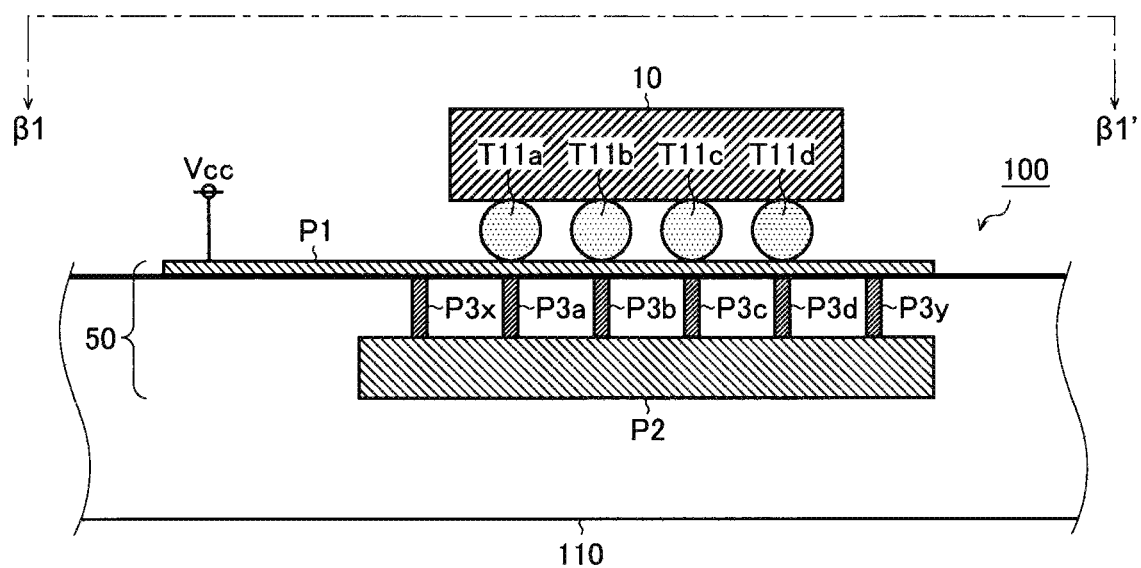
FIG. 11 is a longitudinal section view taken along line $\beta 1$-$\beta 1'$.
Figure 12:
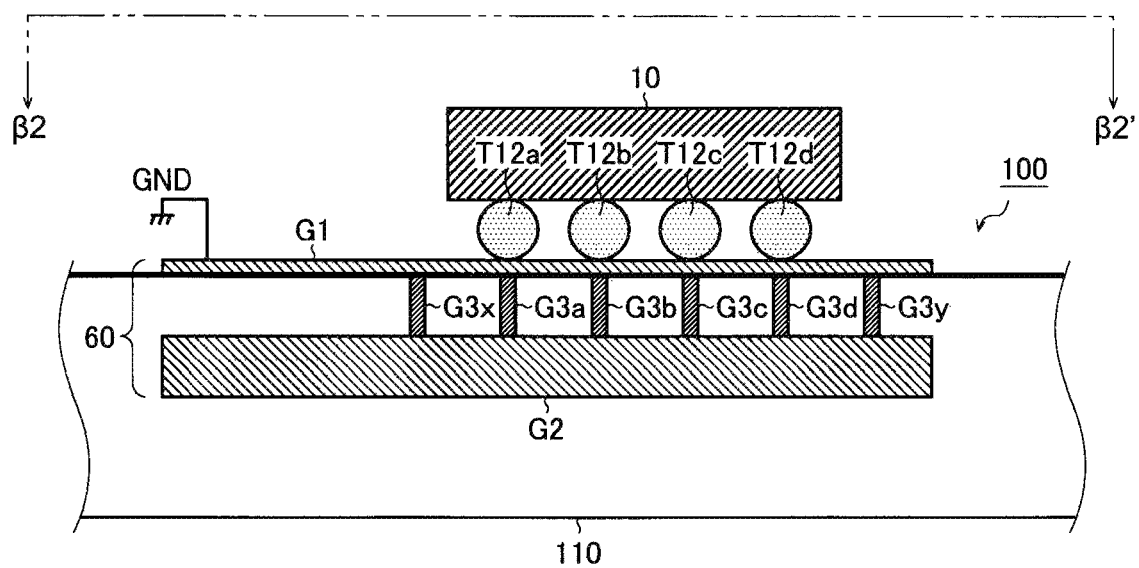
FIG. 12 is a longitudinal section view taken along line $\beta 2$-$\beta 2'$.

FIG. 11 is a longitudinal section view taken along line β1-β1' (dot-dash) in FIG. 9 and FIG. 10 that cuts through the printed wiring board 100. Moreover, FIG. 12 is a longitudinal section view taken along line β2-β2' (dot-dot-dash) in FIG. 9 and FIG. 10 that cuts through the printed wiring board 100.

As illustrated in the drawings, the printed wiring board 100 according to the third embodiment is based on the second embodiment described above (FIG. 3 to FIG. 6) with the addition of interlayer connections P1a to P3d that are respectively formed directly below the power terminals T11a to T11d. Similarly, the interlayer connections G1a to G3d are respectively formed directly below the ground terminals T12a to T12d.

According to such configuration, since the power terminals T11a to T11d and the ground terminals T12a to T12d can be used more efficiently, as compared with the above-mentioned second embodiment, it is feasible to reduce the parasitic component of the power line 50 and ground line 60 more efficiently.

Printed Wiring Board (The Fourth Embodiment)

Hereinbelow, the fourth embodiment of the printed wiring board 100 is discussed in detail primarily by referencing FIG. 13 to FIG. 16.

Figure 13:
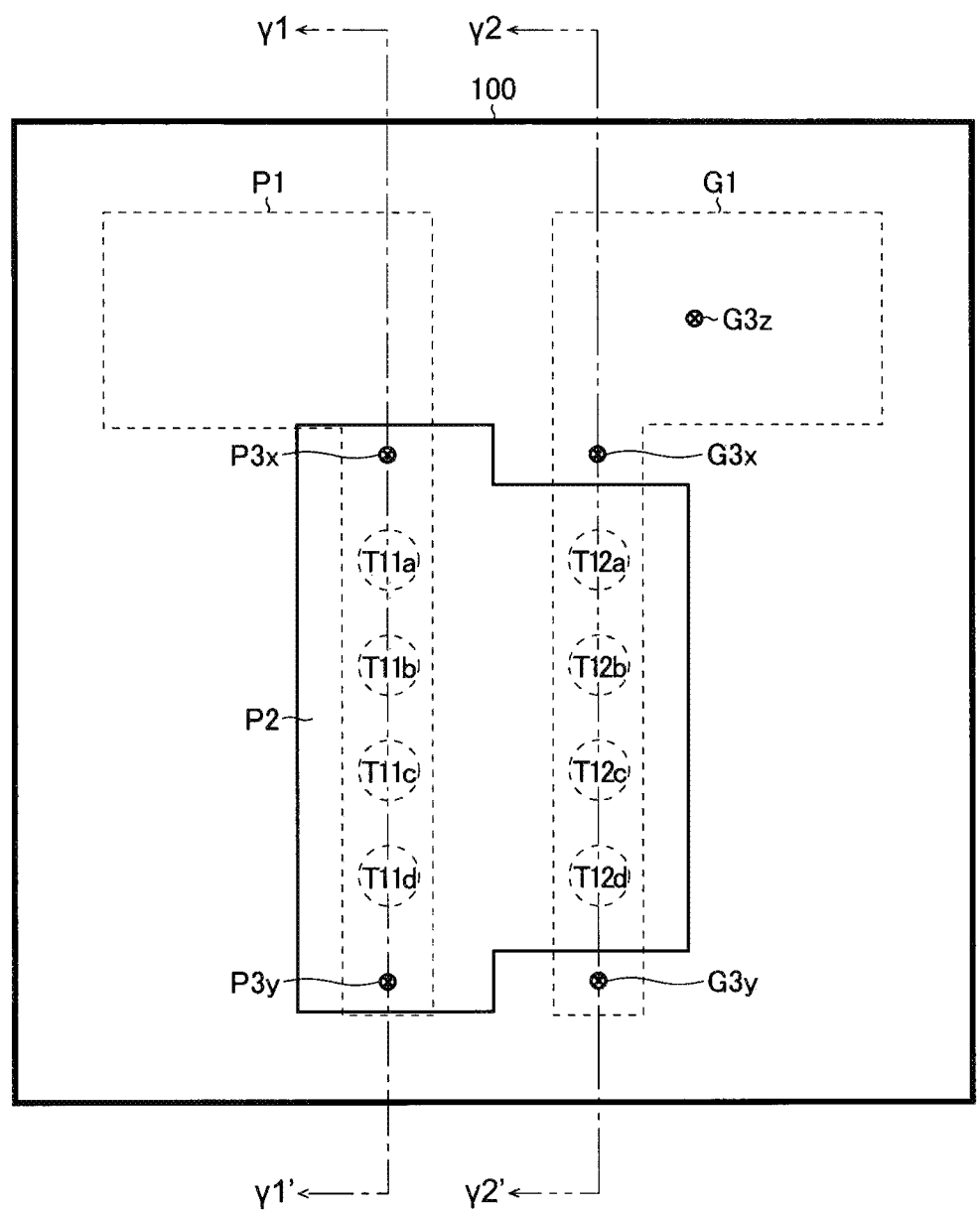
FIG. 13 is a top view illustrating the fourth embodiment of the printed wiring board (the second wiring layer).

FIG. 13 is a top view illustrating the fourth embodiment of the printed wiring board 10; in particular, the second wiring layer that is formed within the printed wiring board 100 (which is lower in relation to the first wiring layer). In the present drawing, the second power line P2 patterned on the second wiring layer is depicted in solid line. However, the first power line P1 and the first ground line G1 patterned on the first wiring layer, and the power terminals T11a to T11d and the ground terminals T12a to T12d disposed at the semiconductor device 10 are all depicted in broken line.

Figure 14:
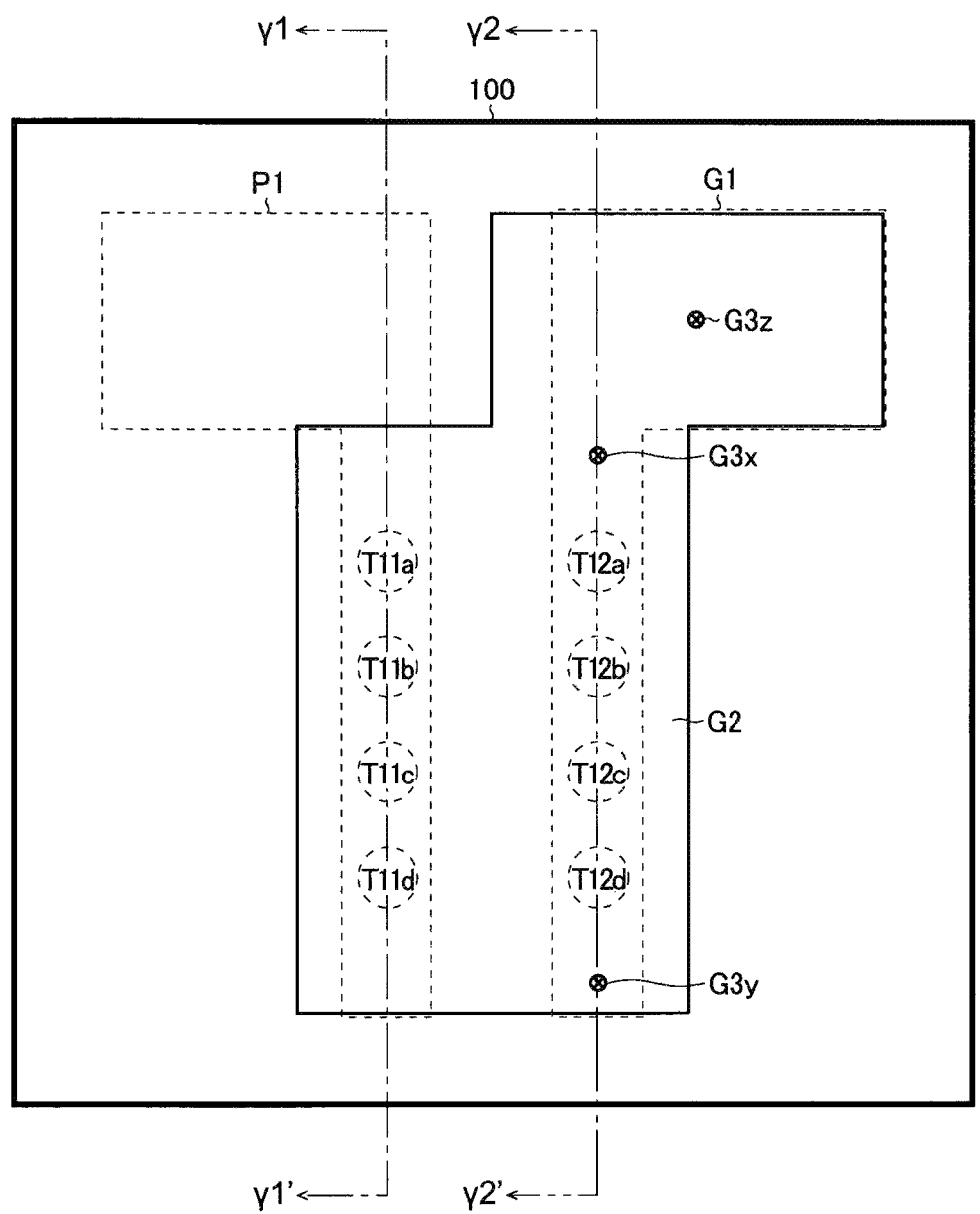
FIG. 14 is a top view illustrating the fourth embodiment of the printed wiring board (the third wiring layer).

FIG. 14, similar to FIG. 13, is a top view illustrating the fourth embodiment of the printed wiring board; in particular, a third wiring layer that is formed within the printed wiring board 100 (which is lower in relation to the second wiring layer). In the present drawing, the second ground line G2 patterned on the second wiring layer is depicted in solid line. However, the first power line P1 and the first ground line G1 patterned on the first wiring layer, and the power terminals T11a to T11d and the ground terminals T12a to T12d disposed at the semiconductor device 10 are all depicted in broken line.

Moreover, in the fourth embodiment of the printed wiring board 100, since the layout of the first wiring layer is the same as that described above in connection with the second embodiment (FIG. 3), description thereof is omitted in these new drawings.

Figure 15:
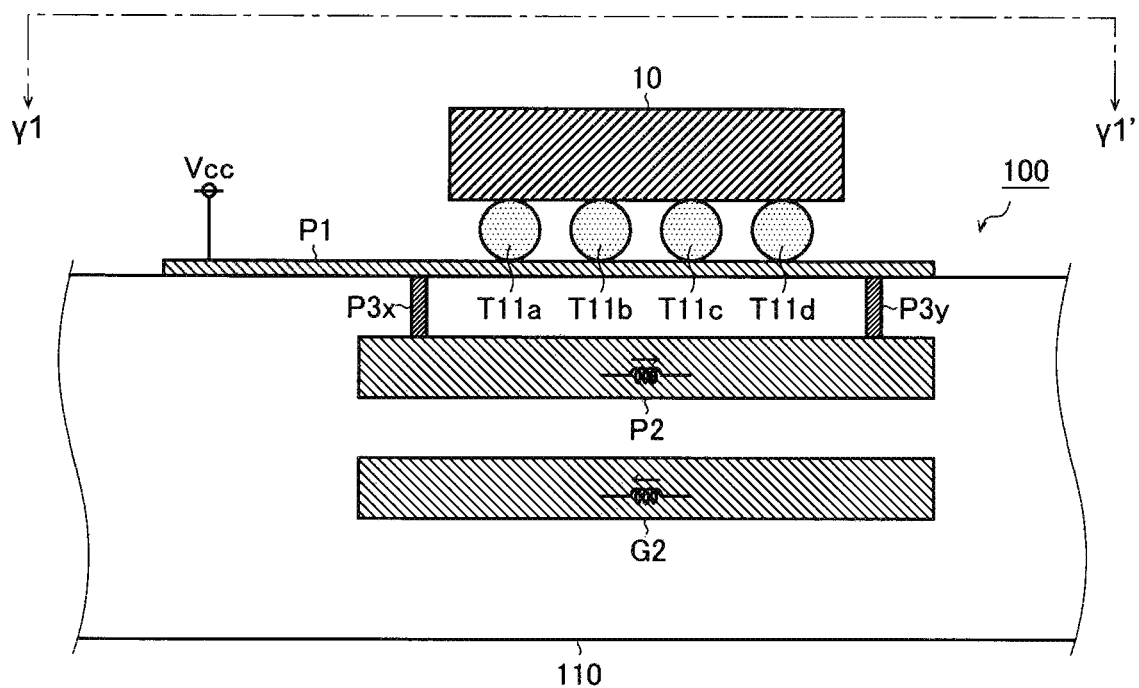
FIG. 15 is a longitudinal section view taken along line γ1-γ1'.
Figure 16:
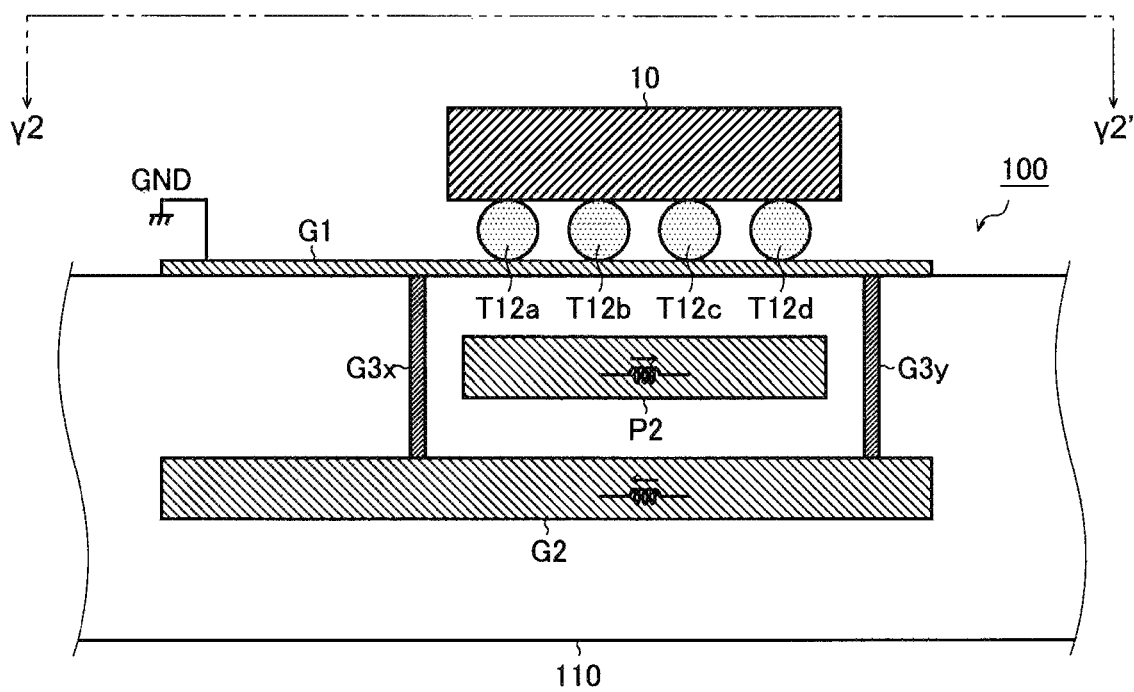
FIG. 16 is a longitudinal section view taken along line γ2-γ2'.

FIG. 15 is a longitudinal section view taken along line γ1-γ1' (dot-dash) in FIG. 13 and FIG. 14 that cuts through the printed wiring board 100. Moreover, FIG. 16 is a longitudinal section view taken along line γ2-γ2' (dot-dot-dash) in FIG. 13 and FIG. 14 that cuts through the printed wiring board 100.

As illustrated in the drawings, the printed wiring board 100 according to the third embodiment is based on the second embodiment described above (FIG. 3 to FIG. 6) with the exception that the second power line P2 and the second ground line G2 are formed on different wiring layers and are overlapped with each other so that the respective currents flow in opposite directions.

According to such configuration, due to the magnetic coupling between the second power line P2 and the second ground line G2, the parasitic components can be offset from each other; hence, the parasitic component of the power line 50 and the ground line 60 can be effectively reduced, as compared with the above-mentioned second embodiment.

Moreover, the configuration of the fourth embodiment can be combined with that described in connection with the above-mentioned third embodiment (FIG. 9 to FIG. 12).

<IC Package>

Figure 17:
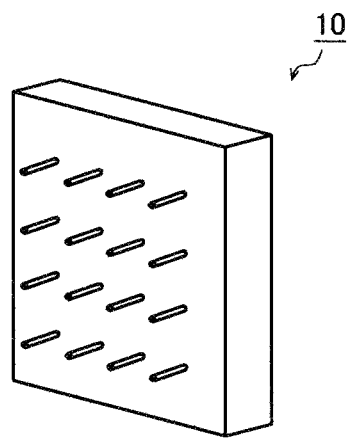
FIG. 17 is a schematic diagram illustrating one variation of an IC package (PGA).
Figure 18:
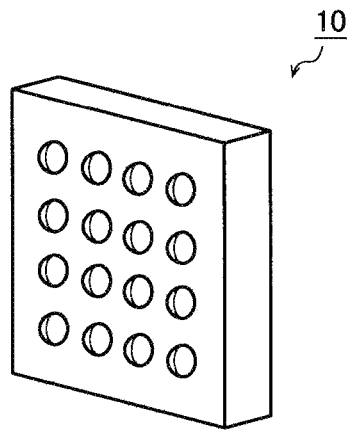
FIG. 18 is a schematic diagram illustrating one variation of an IC package (BGA).
Figure 19:
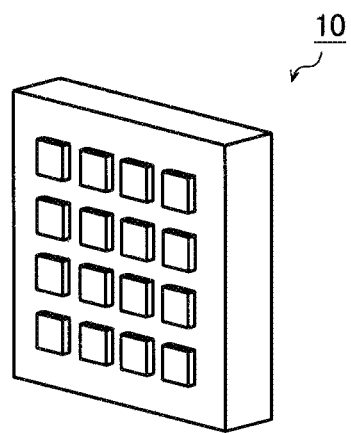
FIG. 19 is a schematic diagram illustrating one variation of an IC package (LGA).

FIG. 17 to FIG. 19 are drawings respectively illustrating the variations of the IC package.

FIG. 17 is a schematic diagram illustrating the pin grid array (PGA) package. When the semiconductor device 10 is used in a PGA package, external terminals (the switch terminal T10, the power terminal T11, and the ground terminal T12, etc.) of the semiconductor device 10 are disposed as pins and are respectively arranged on the bottom surface of the package in an array.

FIG. 18 is a schematic diagram illustrating the ball grid array (BGA) package. When the semiconductor device 10 is used in a BGA package, external terminals of the semiconductor device 10 are disposed as solder balls and are respectively arranged on the bottom surface of the package in an array.

FIG. 19 is a schematic diagram illustrating the land grid array (LGA) package. When the semiconductor device 10 is used in an LGA package, external terminals of the semiconductor device 10 are disposed as electrode pads and are respectively arranged on the bottom surface of the package in an array.

<Example of Application to Electronic Apparatus>

Figure 20:
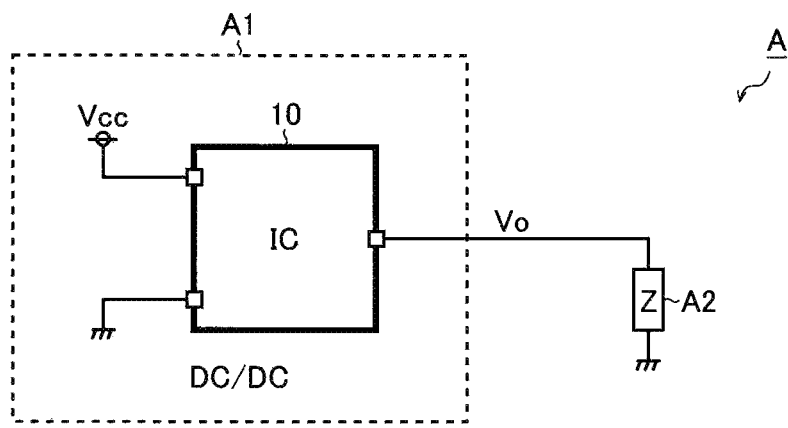
FIG. 20 is a schematic diagram illustrating one variation of the electronic apparatus (a switching power supply device).
Figure 21:
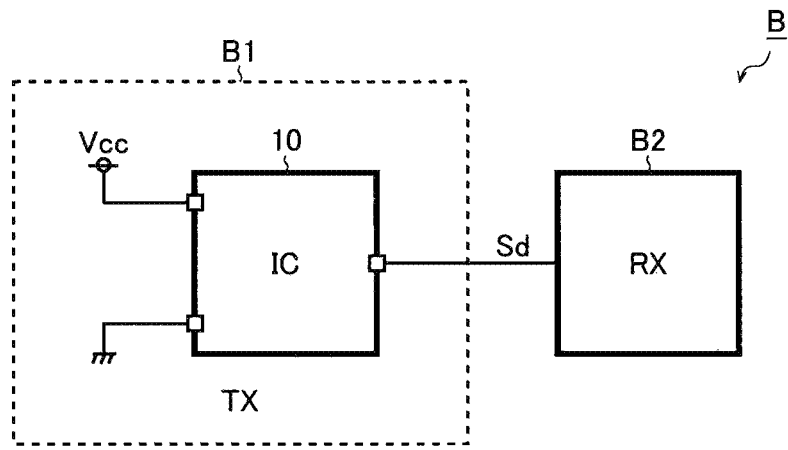
FIG. 21 is a schematic diagram illustrating one variation of the electronic apparatus (a transmission device).
Figure 22:
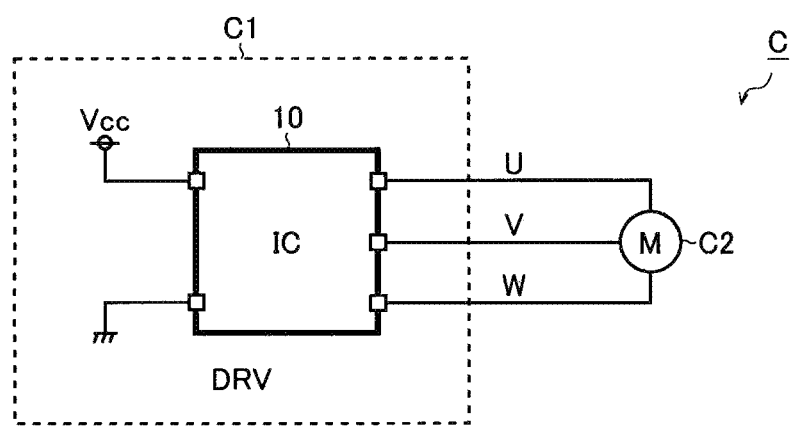
FIG. 22 is a schematic diagram illustrating one variation of the electronic apparatus (a motor driving device).

FIG. 20 to FIG. 22 are drawings respectively illustrating the variations of an electronic apparatus comprising the printed wiring board 100 (or the semiconductor device 10 mounted on the printed wiring board 100).

The electronic apparatus A illustrated in FIG. 20 comprises: a switching power supply device A1, which uses a switch output stage that is integrated in the semiconductor device 10 or externally connected to the semiconductor device 10 to generate an expected output voltage Vo from the power supply voltage Vcc; and a load A2, which receives the supply from the output voltage Vo to operate. The semiconductor device 10 is mounted on the above-mentioned printed wiring board 100 (not explicitly shown in the present drawing), and functions as a part of the switching power supply device A1.

The electronic apparatus B illustrated in FIG. 21 comprises: a transmission device B1, which uses a switch output stage that is integrated in the semiconductor device 10 or externally connected to the semiconductor device 10 to transmit a digital signal Sd; and a receiving device B2, which receives the digital signal Sd. The semiconductor device 10 is mounted on the above-mentioned printed wiring board 100 (not explicitly shown in the present drawing), and functions as a part of the transmission device B1.

The electronic apparatus C illustrated in FIG. 22 comprises: a motor driving device C1, which uses a switch output stage that is integrated in the semiconductor device 10 or externally connected to the semiconductor device 10 to generate motor driving signals U, V, W; and a motor C2, which receives the supply motor driving signals U, V, W to rotate. The semiconductor device 10 is mounted on the above-mentioned printed wiring board 100 (not explicitly shown in the present drawing), and functions as a part of the motor driving device C1.

In this way, the semiconductor device 10 (or the printed wiring board 100 mounted with the semiconductor device 10) can be applied in various applications.

Figure 23:
FIG. 23 is a schematic diagram of the appearance of a smartphone.

FIG. 23 is a schematic diagram of the appearance of a smartphone. The smartphone X is an example of the electronic apparatus A illustrated in FIG. 20; preferably, it is mounted with the switching power supply device A1 that uses the semiconductor device 10 (or the printed wiring board 100 installed with the semiconductor device 10).

<Other Variations>

Further, in addition to foregoing embodiments, various modifications can be made to the technical features disclosed herein without departing from the principles and spirits of the technical creation of the present invention. That is, the foregoing embodiments are exemplary in all aspects, rather than limiting, and it should be understood that the technical scope of the present invention is defined by the appended claims, rather than the discussion of the foregoing embodiments; also, the scope of the present invention should cover the equivalent meanings thereof, as well as all modifications and variations within the cope.

INDUSTRIAL APPLICABILITY

The present invention as disclosed herein is preferably applied, for example, to inhibit the power supply fluctuation in semiconductor devices driven by low voltage while handling a large current.

What is claimed is:

1. An electronic apparatus comprising:
a printed wiring board comprising:
a multi-layer substrate;
a power line, laid on the multi-layer substrate and connected with a first row of power terminals of a semiconductor device; and
a ground line, laid on the multi-layer substrate and connected with a first row of ground terminals of the semiconductor device; wherein,
at least one of the power line or the ground line comprises:
a first wiring pattern, formed on a surface of the multi-layer substrate; and
a second wiring pattern, formed within the multi-layer substrate;
a switch line, laid on the multi-layer substrate and connected with a first row of switch terminals of the semiconductor device, wherein the switch line is partially between the power line and the ground line from a view perspective in a first direction perpendicular to the multi-layer substrate, wherein the first row of power terminals, the first row of ground terminals, and the first row of switch terminals are aligned and extend along a second direction perpendicular to the first direction; and
an output line laid on the multi-layer substrate, wherein the ground line, the switch line, and the output line are partially overlapped from a view perspective in a third direction perpendicular to the first direction and the second direction.

2. The electronic apparatus of claim 1, wherein a width, a thickness, or an electric conductivity of the second wiring pattern is greater than a width, a thickness, or an electric conductivity of the first wiring pattern.

3. The electronic apparatus of claim 1, wherein the interlayer connection is formed in the vicinity of or directly below the first row of power terminals or the first row of ground terminals.

4. The electronic apparatus of claim 1, further comprising an insulating layer that separates the first wiring pattern from the second wiring pattern, and the insulating layer has a thickness of less than about 200 μm.

5. The electronic apparatus of claim 1, wherein the semiconductor device is mounted on the printed wiring board.

6. The electronic apparatus of claim 5, wherein a plurality of external terminals disposed at the semiconductor device are pins, solder balls, or electrode pads, and are arranged in an array on a bottom surface of a package.

7. The electronic apparatus of claim 5, wherein the semiconductor device functions as a part of a power supply device that uses a switch output stage connected between a power terminal and a ground terminal to generate an expected output voltage from a power supply voltage.

8. The electronic apparatus of claim 5, wherein the semiconductor device functions as a part of a transmission device that uses a switch output stage connected between a power terminal and a ground terminal to transmit a digital signal.

9. The electronic apparatus of claim 5, wherein the semiconductor device functions as a part of a motor driving device that uses a switch output stage connected between a power terminal and a ground terminal to drive a motor.

10. The electronic apparatus of claim 1, wherein the power line, the ground line, and the switch line are partially overlapped from a view perspective in the second direction.

11. The electronic apparatus of claim 1, wherein the ground line and the switch line are partially overlapped from a view perspective in the third direction.

12. The electronic apparatus of claim 1, wherein
the output line is connected with the ground line and the switch line.

13. The electronic apparatus of claim 12, wherein the output line is separated from the power line from a view perspective in both the second direction and the third direction.

14. The electronic apparatus of claim 12, wherein the switch line is partially between the ground line and the output line from a view perspective in the second direction.

15. The electronic apparatus of claim 1, further comprising a second row of power terminals, a second row of ground terminals, and a second row of switch terminals aligned and extending along the second direction.

16. The electronic apparatus of claim 15, further comprising a third row of switch terminals extending along the second direction, wherein a total number of the switch terminals in the third row is greater than a total number of the switch terminals in the first row.

17. The electronic apparatus of claim 1, further comprising an output inductor, wherein the output inductor comprises a first portion overlaps with the switch line and a second portion overlaps with the output line from the view perspective in the first direction.

18. The electronic apparatus of claim 1, further comprising an output capacitor, wherein the output capacitor comprises a first portion overlaps with the ground line and a second portion overlaps with the output line from the view perspective in the first direction.

19. The electronic apparatus of claim 1, further comprising a bypass capacitor, wherein the bypass capacitor comprises a first portion overlaps with the power line and a second portion overlaps with the ground line from the view perspective in the first direction, and the bypass capacitor is free from a coverage of a vertical projection area of the switch line.

* * * * *